Nov. 3, 1964 A. C. REID 3,155,928
BRIDGED-T FREQUENCY REJECTION FILTER
Filed June 13, 1961
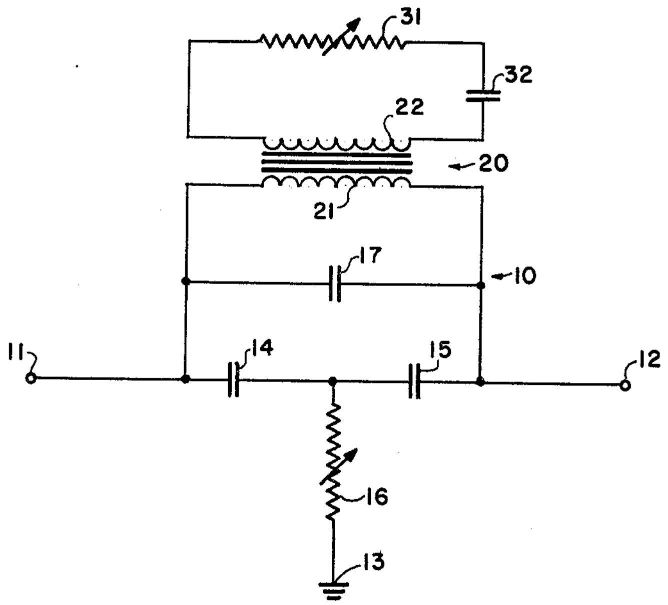
INVENTOR.
ALBERT C. REID
BY
Adams, Forward and McLean
ATTORNEYS United States Patent Office 3,155,928

Patented Nov. 3, 1964

3,155,928

BRIDGED-T FREQUENCY REJECTION FILTER

Albert C. Reid, Tulsa, Okla., assignor, by mesne assignments, to Sinclair Research, Inc., New York, N.Y., a corporation of Delaware Filed June 13, 1961, Ser. No. 116,770

1 Claim. (Cl. 333—75)

My invention relates to electric signal attenuation and in particular provides a bridged-T frequency rejection filter.

Frequency rejection filters of the bridged-T type are characterized by extremely sharp rejection of small frequency bands and moreover characteristically pass transient oscillation of the rejection frequency, discriminating only against relative steady-state signals. As such the bridged-T frequency rejection filters find particular applicability in the removal of single frequency spurious signals where these lie in the spectrum under consideration. Thus, for example, the bridged-T frequency rejection filter finds utility in the removal of 60 cycle hum in seismic amplifiers.

A particular problem with such filters, however, stems from their sharp characteristics and thus the selection of their components requires extreme precision in order that the rejection frequency inherent in the filter coincide with the frequency to be rejected. Thus, typically when the filter is constructed, it is conventional practice to check capacitive requirements of the filter using a decade box to ascertain the precise capacitance required to bring the filter on frequency. In view of the difficulty of obtaining precise capacitive values in the commercially available condensers, it is then the practice to construct the capacitive portion of the filters using several condensers and checking until the predetermined capacitive value has been achieved. This practice obviously is slow and tedious.

It is thus a fundamental object of my invention to provide a bridged-T frequency rejection filter which can be made with commercially available condensers and in which the rejection frequency can be adjusted after construction by relatively simple methods not involving the necessity of removing or adding additional components to the filter to bring it on frequency. Thus, it is a further object of my invention to provide such a filter in which the rejection frequency can be varied to a degree, where this is desirable, by simple mechanical movement of variable components and requiring the adjustment of no more than two mechanically variable components.

In accordance with my invention, the bridged-T frequency rejector which I contemplate basically involves a T-network having capacitive elements in its arms and a resistor in its leg in which the arms are bridged by an inductive element. In order to provide the variable quality referred to above, I provide an associated closed loop circuit containing in series a resistive element, a capacitive element and an inductive element, the latter circuit being closely coupled to the bridged-T filter through inductive coupling of the inductive element of the latter circuit and the bridging inductive element of the bridged-T filter. The resistor in the leg of the bridged-T and the resistive element in the associated loop circuit are both of the variable type and it is through these that the adjustment of rejection frequency can be effected.

For a further explanation of the practical application of my invention, reference is made to the attached drawing which represents an electrical schematic diagram of a bridged-T frequency rejection filter network in accordance with my invention.

Referring to the drawing, the reference numeral 10 designates a bridged-T frequency rejection filter network, while the reference numeral 30 designates a closed R–L–C circuit associated with network 10. Filter network 10 is provided with an input terminal 11, an output terminal 12 and a terminal 13 which is common to both the input and output circuits between which network 10 is to be coupled. A pair of capacitors 14 and 15 which form the arms of the T-portion of network 10 are connected in series respectively between terminals 11 and 12, while a variable resistor 16 which forms the leg of the T is connected between the common connection of capacitors 14 and 15 and terminal 13. In the illustrated case, to achieve the desired nominal capacity of capacitors 14 and 15 without resort to capacitors having unusual values, a third capacitor 17 was connected between terminals 11 and 12 in parallel with the series connection of capacitors 14 and 15.

A choke 20 having a first winding 21 and a separate second winding 22 wound on a common core is utilized to couple circuit 30 and network 10 with the winding 21 forming the bridge in network 10 by its connection between terminals 11 and 12. Winding 22 of choke 20 is connected in circuit 30 which further includes a variable resistor 31 and a capacitor 32 connected in series with winding 22 to complete closed circuit 30.

In practice, the rejection frequency of the filter of my invention is adjusted by means of varying the effective resistance of resistor 16 in network 10 and of resistor 31 in circuit 30. Terminals 11 and 12 are connected between a pair of amplifier stages, to the input side of which a steady signal of the frequency to be rejected is coupled, and resistors 16 and 31 are varied for a maximum attenuation on the output side. Typically such adjustment will be done with the filter installed in the equipment in which it is to be ultimately utilized.

As a matter of note, the equations for a bridged-T network hold true for the frequency rejection filter of my invention. Thus, where, $C_{14}$ is the capacitance of each capacitor 14 and 15, assuming no capacitor 17 is employed;
$L_{eff}$ is the effective inductance of winding 21 in circuit 10;
$R_{eff}$ is the effective resistance of winding 21 in circuit 10, and
$R_{16}$ is the resistance of resistor 16 the proper values of these components for rejection of a frequency having an angular velocity of $\omega$ are determined as follows:

$$C_{14}=\frac{2}{\omega^2 L_{eff}} \quad (1)$$

$$R_{16}=\frac{1}{R_{eff}(\omega C_{14})^2} \quad (2)$$

Analysis of the circuits of the frequency rejection filter of my invention will further show:

$$X_{L_{eff}}=X_{L_{21}}-\frac{X_{L_{22}}X_M^2-X_{C_{32}}X_M^2}{(X_{L_{22}}-X_{C_{32}})^2+R_{31}^2} \quad (3)$$

$$R_{eff}=\frac{R_{31}X_M^2}{(X_{L_{22}}-X_{C_{32}})^2+R_{31}^2} \quad (4)$$

where:

$X_{L_{eff}}$ is the effective reactance of winding 21 in circuit 10, that is, $\omega L_{eff}$,
$X_{L_{21}}$ is the reactance of winding 21,
$X_{L_{22}}$ is the reactance of winding 22,
$X_M$ is the mutual reactance between windings 21 and 22,
$X_{C_{32}}$ is the reactance of capacitor 32, and
$R_{31}$ is the resistance of resistor 31, all the above reactances being taken at the angular velocity $\omega$ of the frequency to be rejected. It will be noted that the actual resistances of windings 21 and 22 have been ignored. The resistance of winding 21 is additive to the right-hand term of Equation 4 and the resistance of winding 22 is the additive with the term $R_{31}$.

Noting the above equations, it will be apparent that $C_{14}$ and $C_{15}$ must have equal capacitance, the capacitor 32 and winding 22 must not be selected to resonate at the desired rejection frequency, that preferably the capacitance of capacitor 32 is substantially smaller than that value which resonates with winding 22 and that the frequency of rejection is dependent both upon the resistance of resistor 16 and the resistance of resistor 31 and can be controlled by adjustment of these two components only.

In a typical construction, the components of the described filter had the following nominal values.

| | | |
|---|---|---|
| Capacitors: | | |
| **14** | microfarads | .0834 |
| **15** | do | .0834 |
| **17** | do | .018 |
| **32** | do | .01 |
| Resistors: | | |
| **16** | ohms | 250K (pot.) |
| **31** | do | 250K (pot.) |
| Choke: | | |
| Winding **21** | henries | 100 |
| Winding **22** | do | 100 |
| Coupling factor | | 0.95 |

Utilizing a filter constructed having the following values, input terminal 11 was connected in series through a 150K resistor to the output terminal of a signal generator, to the other output terminal of which common terminal 13 was connected. Output terminal 12 and terminal 13 had a 470K load resistor connected across them. When resistor 16 connected 95K ohms resistance in circuit 10 and resistor 31 connected 120K ohms resistance in circuit 30 with the signal generator output adjusted to 4 volts across terminals 11 and 13, the following voltages were obtained across terminals 12 and 13 at the indicated frequencies.

| Frequency, c.p.s.: | Output, millivolts |
|---|---|
| 10 | 4000 |
| 20 | 3600 |
| 30 | 3400 |
| 40 | 3400 |
| 50 | 3200 |
| 55 | 2600 |
| 57 | 1830 |
| 58 | 1370 |
| 59 | 700 |
| 60 | 17 |
| 61 | 540 |
| 62 | 1000 |
| 63 | 1400 |
| 70 | 2650 |
| 80 | 3000 |
| 90 | 3200 |
| 100 | 3200 |

It will be observed that rejection of a steady state 60 cycle signal was on the order of 100 to 1, while within three cycles on each side of such frequency the signal was down on the order of 2 to 1 only. It should also be noted that the rejection frequency can be varied within ±2½% of center by adjustment of resistors 16 and 31 while still obtaining essentially a null rejection. Resistor 16, however, should not go to zero as can be seen from Equation 2.

While I have illustrated circuit 30 as a simple loop, it will be evident that many variations are permissible, as the occasion may demand, and the only essential requirement is that a variable resistor be included effectively in series with winding 22.

I claim:

In a bridged-T frequency rejection filter including a T-network having capacitive elements in each arm thereof and a resistive element in the leg thereof and including an inductive element bridging said capacitive elements, the improvement which includes a circuit closed upon itself having an inductive element, a resistive element and a capacitive element connected in series, said inductive element in said circuit being closely coupled inductively to said inductive element in said network, said circuit being non-resonant in the frequency band of interest, and said resistive elements in said network and circuit both being variable resistors whereby the effective inductance of said inductive element in said network is a function of the resistive value of said resistor in said closed circuit and whereby the rejection frequency of said filter can be varied through a limited range by adjustment of the resistive values of said resistors in said network and in said circuit.

References Cited in the file of this patent

UNITED STATES PATENTS

| | | |
|---|---|---|
| 1,897,639 | Kreer | Feb. 14, 1933 |
| 2,002,216 | Bode | May 21, 1935 |
| 2,093,665 | Tellegen | Sept. 21, 1937 |
| 2,167,079 | Landon | July 25, 1939 |
| 2,173,427 | Scott | Sept. 19, 1939 |
| 2,567,380 | Kingsbury | Sept. 11, 1951 |
| 2,832,047 | Miller | Apr. 22, 1958 |
| 2,867,779 | Bardeen et al. | Jan. 6, 1959 |

FOREIGN PATENTS

| | | |
|---|---|---|
| 862,172 | Germany | Jan. 8, 1953 |